(12) United States Patent
Tobita

(10) Patent No.: US 6,903,943 B2
(45) Date of Patent: Jun. 7, 2005

(54) SWITCHING CIRCUIT

(75) Inventor: Atsuhiro Tobita, Hanno (JP)

(73) Assignee: Shindengen Electric Manufacturing Co. Ltd., Tokyo (JP)

( * ) Notice: Subject to any disclaimer, the term of this patent is extended or adjusted under 35 U.S.C. 154(b) by 20 days.

(21) Appl. No.: 10/429,748

(22) Filed: May 6, 2003

(65) Prior Publication Data

US 2003/0210118 A1 Nov. 13, 2003

(30) Foreign Application Priority Data

May 10, 2002 (JP) ..................................... P2002-134845

(51) Int. Cl.[7] ............................................. H02M 3/335
(52) U.S. Cl. .................... 363/19; 363/21.08; 363/21.16
(58) Field of Search .............................. 363/16, 18, 19, 363/21.07, 21.08, 21.09, 21.16, 21.17

(56) References Cited

U.S. PATENT DOCUMENTS

| 3,708,743 A | 1/1973 | Grangaard et al. ...... 323/22 SC |
| 4,087,703 A | 5/1978 | Akamatsu ................... 307/253 |
| 4,335,334 A | 6/1982 | Hosoya ....................... 315/408 |
| 5,313,109 A | 5/1994 | Smith .......................... 307/270 |
| 6,038,143 A | 3/2000 | Miyazaki et al. ............. 363/19 |
| 6,108,219 A | 8/2000 | French ......................... 363/23 |
| 6,137,695 A | 10/2000 | Takida et al. ................ 363/19 |
| 6,504,270 B1 | 1/2003 | Matsushita .................. 307/140 |
| 6,608,769 B2 * | 8/2003 | Bergk ...................... 363/21.17 |

FOREIGN PATENT DOCUMENTS

| JP | 11-069803 | 3/1999 |
| JP | 11-262261 | 9/1999 |
| SU | 1762374 A1 | 9/1992 |

* cited by examiner

Primary Examiner—Jessica Han
(74) Attorney, Agent, or Firm—Nixon & Vanderhye, PC

(57) ABSTRACT

This switching circuit includes a transformer having primary and secondary windings insulated from each other; a voltage-driven switching element which is connected in series to one of the primary and secondary windings and has a control terminal for controlling a switching operation thereof; a drive circuit which has an output connected to the control terminal and drives the main switching element; and an auxiliary winding which is provided in parallel to the primary winding of the transformer and has an output connected to the control terminal via a capacitor with positive feedback.

18 Claims, 4 Drawing Sheets

6,903,943 B2

SWITCHING CIRCUIT

BACKGROUND OF THE INVENTION

1. Field of the Invention

The present invention relates to a switching circuit including a voltage-driven main switching element connected in series to a winding of a transformer which has primary and secondary windings being insulated from each other.

2. Description of the Related Art

FIG. 6 shows an example of a conventional switching circuit (switching regulator), and FIG. 7 is a graph showing the operating waveform of the switching circuit. In this switching circuit, a voltage-driven main switching element 102 is connected in series to a primary windings of a transformer 101, the primary and secondary windings thereof being insulated from each other. The output of a drive circuit 103 is connected to the control terminal of the main switching element 102, and the drive circuit 103 applies a frequency-controlled drive pulse to the main switching element 102.

However, in the structure described above, the switching speed is dependent on the rise of the drive signal, the rising speed, and the impedance of the drive circuit 103. Thus, in the case that the output impedance of the drive circuit 103 is high or in the case that the switching speed is slow, as shown in FIG. 7, there are the problems that the rise slows and the switching loss increases because the current passes through the active area of the main switching element 2.

In order to reduce the switching loss, it is necessary to increase the switching speed. However, there is the problem that this is limited by the performance of the drive circuit 103. In addition, in particular, because the speed of the drive is dependent on the speed of the control circuit and the like, it is necessary to select a control circuit with a good performance in order to increase the speed.

In consideration of the problems described above, it is an object of the present invention to provide a novel switching circuit that makes possible increasing the switching speed and decreasing the switching loss.

SUMMARY OF THE INVENTION

A switching circuit of the present invention comprises: a transformer having a primary and secondary windings insulated from each other; a voltage-driven switching element which is connected in series to one of the primary and secondary windings and has a control terminal for controlling switching operation thereof; a drive circuit which has an output connected to the control terminal and drives the main switching element; and an auxiliary winding which is provided in parallel to the primary and secondary windings of the transformer and has an output connected to the control terminal via a capacitor with positive feedback. This switching circuit may be a switching regulator.

According to this switching circuit, because the output of the auxiliary winding of the transformer is connected via the capacitor so that positive feedback is applied from the transformer when the voltage of the control terminal of the switching element exceeds a threshold value, the switching transition interval of the switching circuit can be made high speed and the switching loss can be decreased independent of the switching speed of the control circuit or the output impedance of the drive circuit.

DESCRIPTION OF THE PREFERRED EMBODIMENT

Figure 1:
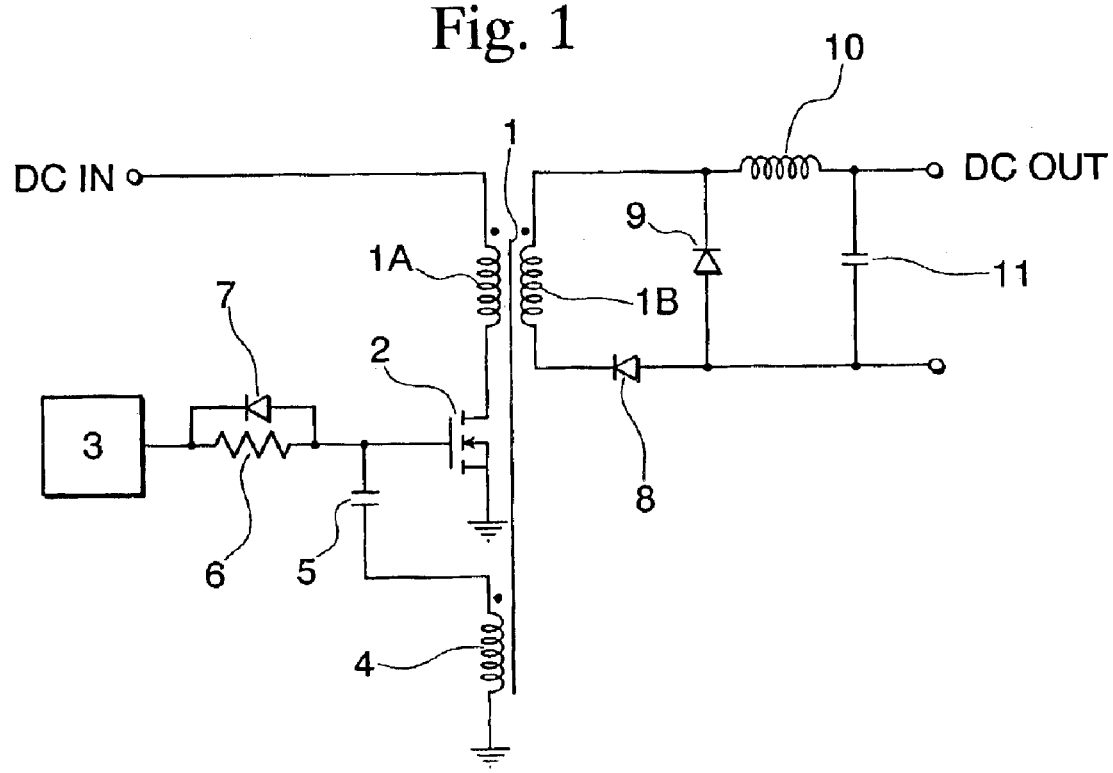
FIG. 1 is a circuit diagram showing an embodiment of the present invention.

An embodiment of the switching circuit according to the present invention will be explained with reference to the attached figures. FIG. 1 shows an embodiment of the switching circuit (switching regulator) according to the present invention. This switching circuit includes a transformer 1 having a primary winding 1A, a secondary winding 1B, and an auxiliary winding 4. The primary winding 1A and the secondary winding 1B are insulated from each other, and the auxiliary winding 4 is provided in parallel with the primary winding 1A and the secondary winding 1B.

A voltage-driven main switching element 2, which may be an FET, is connected in serial to the primary winding 1A of the transformer 1. The gate (control terminal) of the switching element 2 is connected to an output of a drive circuit 3 via a parallel circuit consisting of a resistor 6 and a diode 7. The output of the auxiliary winding 4 is connected to the gate of the main switching element 2 via a capacitor 5 with positive feedback.

In this embodiment, as shown in FIG. 1, two diodes 8 and 9, a choke coil 10, and a capacitor 11 are connected to the secondary winding 1B of the transformer 1, so that the switching circuit outputs a DC current. However, the present invention is not restricted to this structure, and another circuit may be connected to the secondary winding 1B.

Figure 2:
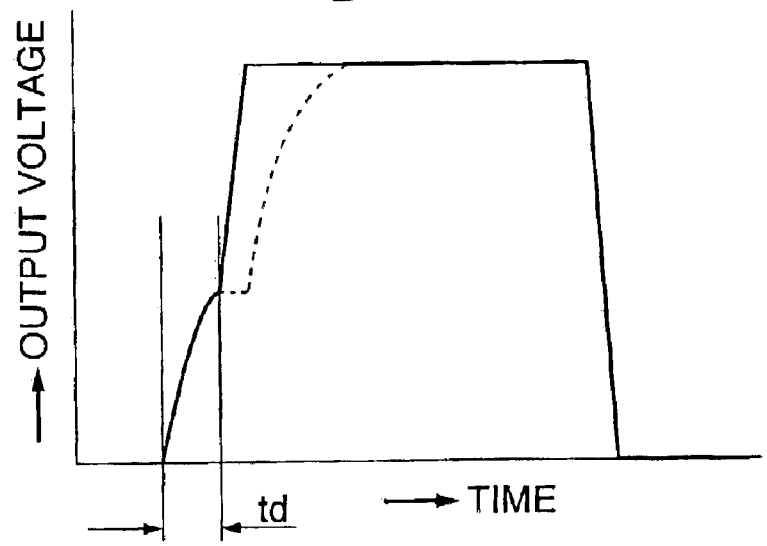
FIG. 2 is an operating waveform graph according to this embodiment.

Next, the operation of the present embodiment will be explained. The drive circuit 3 outputs pulse signals while controlling the frequency of the pulse signals based on the output voltage of the switching circuit. When a pulse signal is input to the gate of the main switching element 2 from the drive circuit 3, the main switching element 2 is switched ON, and current flows to the primary winding 1A of the transformer 1. When the voltage of the gate of the main switching element 2 reaches a threshold value at time "td", the intensity of the signal sent from the drive circuit 3 attenuates, and the rise of the output voltage of the switching circuit is about to slow down. On the other hand, when the current flows to the primary winding 1A of the transformer 1, simultaneously, the auxiliary winding 4 generates current. This current charges the capacitor 5, and the voltage stored in the capacitor 5 is applied to the gate of the main switching element 2. Therefore, the voltage of the gate of the main switching element 2 exceeds the threshold value by the addition of the voltage of the capacitor 5, positive feedback is applied to the main switching element 2 from the auxiliary winding 4. Thereby, as shown in FIG. 2, the rise of the output voltage of the switching circuit can be accelerated in comparison with the case where such a positive feedback is not applied as shown by a dotted line in FIG. 2.

The above embodiment is an example of forward converter. However, the present invention can be applied in any switching circuit that includes a voltage-driven main switching element connected in serial to the winding of a transformer, the primary and secondary windings thereof being isolated.

In addition, a resistor can also be connected in series to the capacitor 5.

According to the present invention, it is possible to shorten the switching transition interval of the switching element and decrease the switching loss by connecting the output of the auxiliary winding of the transformer via a capacitor so that there is no dependence on the switching speed of a control circuit and the output impedance of the drive circuit, and positive feedback from the transformer is applied when the gate of the switching element exceeds a threshold value.

Figure 3:
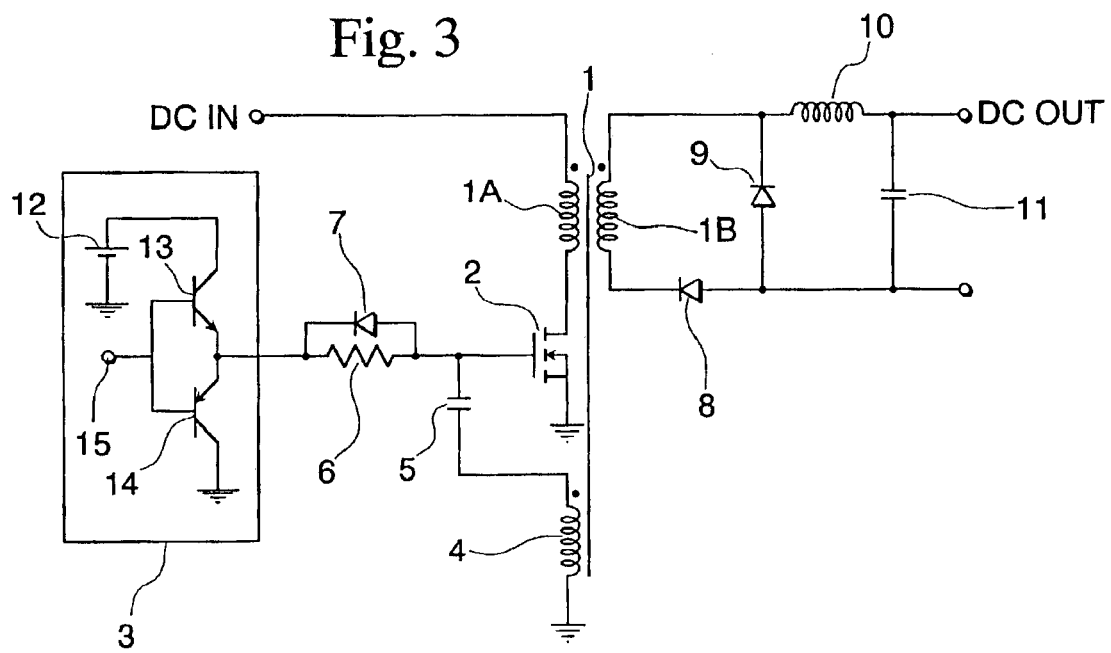
FIG. 3 is a circuit diagram showing another embodiment of the present invention.
Figure 4:
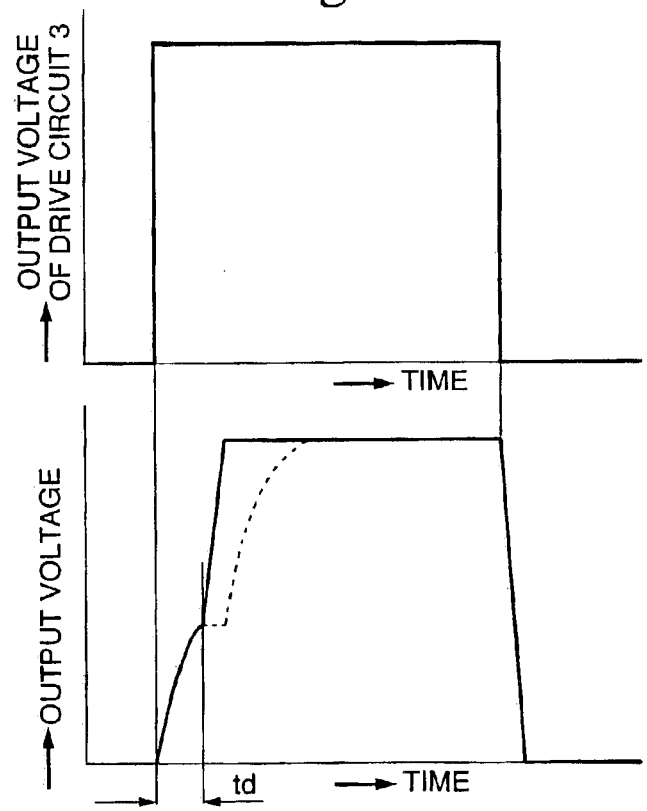
FIG. 4 is an operating waveform graph according to the embodiment shown in FIG. 3.

FIG. 3 shows another embodiment of the present invention. In this embodiment, the drive circuit 3 includes a referential DC source 12 and a buffer consisting of an npn transistor 13 and a pnp transistor 14. The emitters of the transistors 13 and 14 are connected to the diode 7 and the resistor 6. The collector of the transistor 13 is connected to the referential DC source 12, the collector of the transistor 14 is earthed, and an input terminal 15 is connected to the gates of the transistors 13 and 14. By applying an AC control signal to the input terminal 15, the drive circuit 3 outputs square waves at predetermined intervals as shown in the upper graph of FIG. 4, and the switching circuit outputs DC voltage as shown in the lower graph of FIG. 4. Other structures are the same as those of the embodiment shown in FIG. 1. However, the drive circuit which can be applied to the present invention is not restricted to that shown in FIG. 3, and any modifications are possible.

Figure 5:
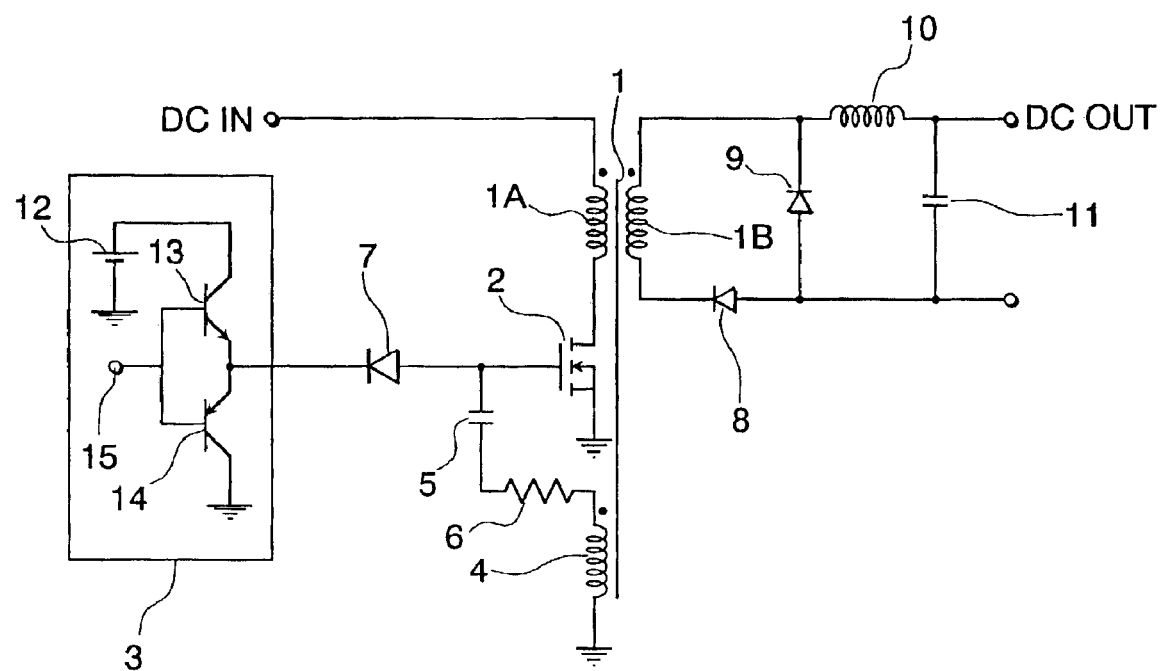
FIG. 5 is a circuit diagram showing another embodiment of the present invention.
Figure 6:
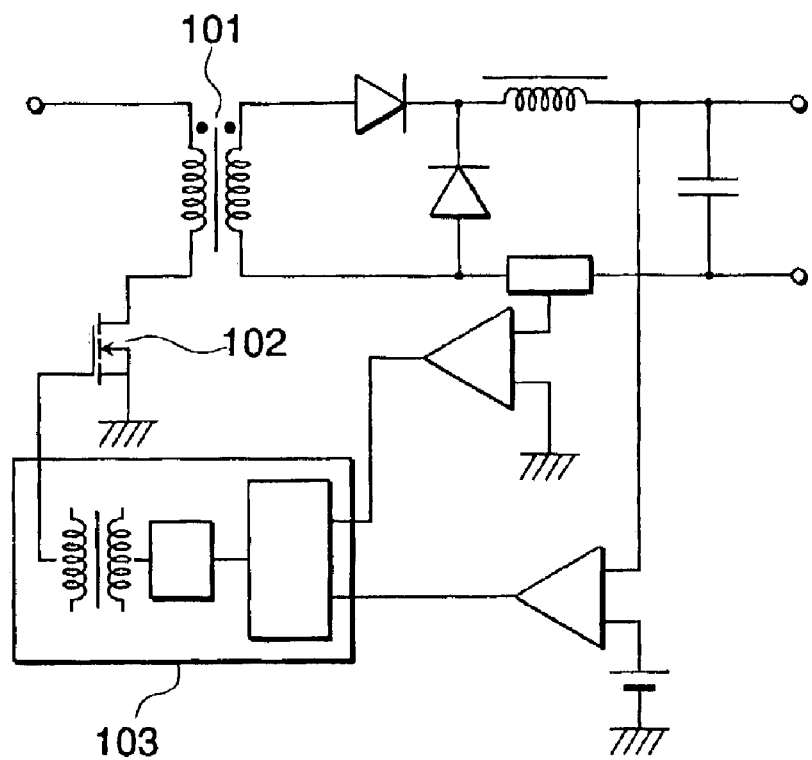
FIG. 6 is a circuit diagram showing a conventional example.
Figure 7:
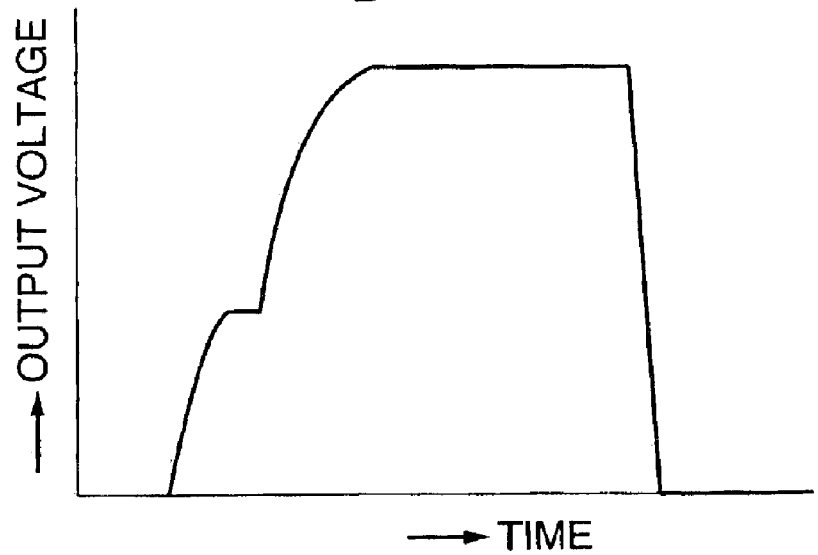
FIG. 7 is an operating waveform graph according to this conventional example.

Furthermore, FIG. 5 shows another embodiment of the present invention. In this embodiment, the resistor 6 is connected between the capacitor 5 and the auxiliary winding 4 instead of being connected parallel to the diode 7. Other structures are the same as those of the embodiment shown in FIG. 3. This embodiment can provide the same effect as the above-mentioned embodiments.

What is claimed is:

1. A switching circuit comprising:
   a transformer comprising a primary winding and a secondary winding insulated from each other;
   a voltage-driven switching element connected in series with one of the primary winding and the secondary winding and including a control terminal for controlling a switching operation thereof;
   a drive circuit connected to the control terminal for driving the switching element;
   an auxiliary winding provided in parallel to the primary winding and having an induced voltage whose polarity is the same as that of the primary winding; and
   a capacitor comprising one terminal connected to the auxiliary winding and another terminal connected to the control terminal of the switching element,
   wherein when the control terminal of the switching element exceeds a predetermined voltage, the auxiliary winding provides a voltage to the control terminal of the switching element in positive feedback via the capacitor to accelerate a rise of an output of the switching circuit.

2. A switching circuit according to claim 1, wherein the voltage-driven switching element is an FET having a gate as the control terminal.

3. A switching circuit according to claim 1, further comprising a resistor connected between the capacitor and the auxiliary winding.

4. A switching circuit according to claim 1, wherein the predetermined voltage is a threshold voltage of the control terminal of the voltage-driven switching element.

5. A switching circuit according to claim 4, wherein the threshold voltage is determined by a size of the control terminal of the switching element.

6. A switching element according to claim 1, wherein the gain of the positive feedback is determined by the capacitor.

7. A switching element according to claim 1, wherein the drive circuit comprises:
   a buffer connected between a power supply voltage and a reference voltage.

8. A switching element according to claim 7, wherein the buffer comprises first and second bipolar transistors connected in series and an input signal is supplied to respective bases of the first and second bipolar transistors.

9. A switching circuit comprising:
   a transformer comprising a primary winding and a secondary winding insulated therefrom;
   a voltage-driven switching element connected in series with one of the primary winding and the secondary winding and comprising a control terminal for controlling a switching operation thereof;
   a drive circuit connected to the control terminal for driving the switching element;
   an auxiliary winding providing an induced voltage whose polarity is the same as that of the primary winding; and
   a capacitor comprising a first terminal connected to the control terminal of the switching element and a second terminal connected to the auxiliary winding via an electrical path with no branches therein.

10. A switching circuit according to claim 9, wherein the voltage-driven switching element is an FET comprising a gate as the control terminal.

11. A switching circuit according to claim 9, further comprising a resistor connected in the electrical path between the second terminal of the capacitor and the auxiliary winding.

12. A switching circuit according to claim 9, wherein the predetermined voltage is a threshold voltage of the voltage-driven switching element.

13. A switching circuit according to claim 12, wherein the threshold voltage is determined by a size of the switching element.

14. A switching element according to claim 9, wherein the gain of the positive feedback is provided via the capacitor.

15. A switching element according to claim 9, wherein a current output terminal of the auxiliary winding is connected to the second terminal of the capacitor via the electrical path with no branches therein.

16. A switching element according to claim 9, wherein the drive circuit comprises:
   a buffer connected between a power supply voltage and a reference voltage.

17. A switching element according to claim 9, wherein the buffer comprises first and second bipolar transistors connected in series and an input signal is supplied to respective bases of the first and second bipolar transistors.

18. A switching element according to claim 9, wherein when a voltage at the control terminal of the switching element exceeds a predetermined voltage, the auxiliary winding provides a voltage to the control terminal of the switching element in positive feedback via the capacitor to accelerate a rise of an output of the switching circuit.

* * * * *